(12) United States Patent
Itahara

(10) Patent No.: US 7,319,362 B2
(45) Date of Patent: Jan. 15, 2008

(54) POWER AMPLIFYING APPARATUS

(75) Inventor: Hiroshi Itahara, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 104 days.

(21) Appl. No.: 10/560,288

(22) PCT Filed: Mar. 1, 2004

(86) PCT No.: PCT/JP2004/002479

§ 371 (c)(1),
(2), (4) Date: Dec. 12, 2005

(87) PCT Pub. No.: WO2004/114517

PCT Pub. Date: Dec. 29, 2004

(65) Prior Publication Data

US 2007/0109045 A1 May 17, 2007

(30) Foreign Application Priority Data

Jun. 19, 2003 (JP) ............................. 2003-174957

(51) Int. Cl.
*H03F 3/38* (2006.01)
(52) U.S. Cl. ........................................ 330/10; 330/136
(58) Field of Classification Search .................. 330/10, 330/136, 149
See application file for complete search history.

(56) References Cited

U.S. PATENT DOCUMENTS 5,404,378 A * 4/1995 Kimura ....................... 375/296
5,952,895 A 9/1999 McCune, Jr. et al. ....... 332/128
6,507,731 B1 * 1/2003 Hasegawa ................... 330/149

FOREIGN PATENT DOCUMENTS

JP 9-69733 3/1997
WO WO 01/58012 A2 8/2001

* cited by examiner

*Primary Examiner*—Khanh Van Nguyen
(74) *Attorney, Agent, or Firm*—Pearne & Gordon LLP

(57) ABSTRACT

A power amplifying apparatus has: a signal converting section (20) which converts an input signal of an orthogonal coordinate system to an amplitude signal and phase signal of a polar coordinate system, which then converts the phase signal to an orthogonal-coordinate phase signal of the orthogonal coordinate system, and which outputs the amplitude signal and the orthogonal-coordinate phase signal; a modulating section (30) which performs orthogonal modulation on the orthogonal-coordinate phase signal, and which outputs the modulated signal to a nonlinear power amplifier (2); and a correcting section (40) which outputs a gain control signal for the nonlinear power amplifier (2). The correcting section (40) has a correction LUT which is produced on the basis of an output signal of the nonlinear power amplifier (2) and the input signal of the orthogonal coordinate system, and outputs the gain control signal with reference to the correction LUT on the basis of the amplitude signal.

3 Claims, 3 Drawing Sheets

POWER AMPLIFYING APPARATUS

TECHNICAL FIELD

The present invention relates to a power amplifying apparatus which is used in a radio communication apparatus and the like.

BACKGROUND ART

A diagram of a conventional power amplifying apparatus is shown in FIG. 4. As shown in the figure, the power amplifying apparatus is configured by an RC (Raised Cosine) filter 110, DA converters (hereinafter, DACs) 120i, 120q, smoothing filters (hereinafter, SMFs) 130i, 130q, an orthogonal modulating section 140, and a linear power amplifier 150.

The digital RC filter 110 conducts base-band band limitation on each of an in-phase component (hereinafter, I signal) and orthogonal component (hereinafter, Q signal) of an input signal. The DA converters 120i, 120q convert the I and Q signals output from the digital RC filter 110, to digital signals, respectively. The SMFs 130i, 130q remove alias from signals output from the DACs 120i, 120q, respectively.

The orthogonal modulating section 140 performs orthogonal modulation on outputs of the SMFs 130i, 130q, and up-converts the modulated outputs to an RF signal. As the method of the orthogonal modulation, useful are the superheterodyne method which uses an orthogonal modulator and a mixer, the direct modulation method, and the like. The linear power amplifier 150 amplifies a modulated signal from the orthogonal modulating section 140. In this way, an output of the power amplifying apparatus is obtained.

In the power amplifying apparatus shown in FIG. 4, since a linear power amplifier is used as the amplifier 150, there is a circumstance where the efficiency of the output signal with respect to the input signal is low.

Therefore, the LINC (Linear Amplification with Nonlinear Components) method which uses a nonlinear power amplifier to conduct linear amplification attracts attention. In the LINC method, since a nonlinear power amplifier is used, the efficiency of the output signal with respect to the input signal is enhanced.

FIG. 5 shows a power amplifying apparatus using the LINC method. As shown in the figure, the power amplifying apparatus using the LING method is configured by a signal converting circuit 210, a voltage controlled oscillator (hereinafter, VCO) 220, and a nonlinear power amplifier 230.

The signal converting circuit 210 converts the I and Q signals of the input signal from the orthogonal coordinate system to the polar coordinate system, and outputs an amplitude component A(t) and phase component θ(t) of the polar coordinate signal. The conversion from the orthogonal coordinate system to the polar coordinate system is indicated by Exp. (1):

$$I(t)+jQ(t)=A(t)\exp(j\theta(t)) \quad (1)$$

Furthermore, the signal converting circuit 210 applies directly modulation on the VCO 220 with using the phase component q(t). The VCO 220 performs phase modulation on the basis of q(t), and outputs a modulated signal. The signal modulated by the VCO 220 is input to the nonlinear power amplifier 230, and also to the signal converting circuit 210 in order to compensate a VCO control signal.

Moreover, the signal converting circuit 210 controls the gain of the nonlinear power amplifier 230 on the basis of the amplitude component A(t).

On the basis of the amplitude component A(t) output from the signal converting circuit 210, the nonlinear power amplifier 230 amplifies the amplitude component A(t) output from the signal converting circuit 210, and the modulated signal output from VCO 220.

According to the configuration shown FIG. 5, the signal which has undergone phase modulation has a very low peak average power ratio (hereinafter, PAR), and hence is not distorted even when a nonlinear power amplifier is used. Therefore, a nonlinear power amplifier can be used, and the efficiency of the output signal with respect to the input signal can be made higher than the case where a linear power amplifier is used. Moreover, the signal converting circuit 210 can be integrated into one chip, and a power amplifying apparatus, and a communication terminal apparatus on which the power amplifying apparatus is mounted can be miniaturized and reduced in cost.

In the case where the power amplifying apparatus of the configuration shown in FIG. 5 is applied to a signal having a high dynamic range, however, the linearity of the gain control cannot be held. Consequently, there is a circumstance where such a power amplifying apparatus cannot be applied to a base station in a third-generation communication system using the CDMA system or the like, or base and mobile stations in a fourth-generation communication system (using the OFDM system or the like) in which a signal having a high dynamic range is required.

In the case where a power amplifying apparatus is applied to a broadbanded system such as a base station in a third-generation communication system or base and mobile stations in a fourth-generation communication system, moreover, the response speed of a VCO cannot follow. Consequently, there is a circumstance where a phase-modulated signal is distorted, and distortion characteristics such as the adjacent channel leakage power ratio (ACLR) characteristic are impaired.

DISCLOSURE OF THE INVENTION

The invention has been conducted in view of the above-mentioned circumstances. It is an object of the invention to provide a power amplifying circuit which can be applied to a communication system using a broadband and high dynamic signal.

The power amplifying apparatus of the invention is an power amplifying apparatus which performs linear amplification with using a nonlinear power amplifier, and in which the apparatus includes: a signal converting section which converts an input signal of an orthogonal coordinate system to an amplitude signal and phase signal of a polar coordinate system, which then converts the phase signal to an orthogonal-coordinate phase signal of the orthogonal coordinate system, and which outputs the amplitude signal and the orthogonal-coordinate phase signal; a modulating section which performs orthogonal modulation on the orthogonal-coordinate phase signal, and which outputs the modulated signal to the nonlinear power amplifier; and a correcting section which outputs a gain control signal for the nonlinear power amplifier, and the correcting section has a correction table which is produced on the basis of an output signal of the nonlinear power amplifier and the input signal of the orthogonal coordinate system, and outputs the gain control signal with reference to the correction table on the basis of the amplitude signal.

According to the configuration, it is possible to provide a power amplifying apparatus which can be adapted to a broadbanded communication system, which, even when applied to a signal having a high dynamic range, can perform a gain control holding a high linearity, and which is more efficient.

Furthermore, the power amplifying apparatus of the invention is an power amplifying apparatus which performs linear amplification with using a nonlinear power amplifier, and in which the apparatus includes: a signal converting section which converts an input signal of an orthogonal coordinate system to an amplitude signal and phase signal of a polar coordinate system, which then corrects the phase signal, which converts the corrected phase signal to an orthogonal-coordinate phase signal of the orthogonal coordinate system, and which outputs the amplitude signal and the orthogonal-coordinate phase signal; a modulating section which performs orthogonal modulation on the corrected orthogonal-coordinate phase signal, and which outputs the modulated signal to the nonlinear power amplifier; and a correcting section which outputs a gain control signal for the nonlinear power amplifier, and a phase correction signal that is used in the correction of the phase signal in the converting section, and the correcting section has a correction table which is produced on the basis of an output signal of the nonlinear power amplifier and the input signal of the orthogonal coordinate system, and outputs the gain control signal and the phase correction signal with reference to the correction table on the basis of the amplitude signal.

According to the configuration, it is possible to provide a power amplifying apparatus which can be adapted to a broadbanded communication system, which, even when applied to a signal having a high dynamic range, can perform a gain control holding a high linearity, and which is more efficient. Furthermore, the power amplifying apparatus can compensate distortion of a phase component.

In the power amplifying apparatus of the invention, moreover, at least one of the signal converting section, the modulating section, and the correcting section is integrated into one chip.

According to the configuration, the power amplifying apparatus can be miniaturized.

In the power amplifying apparatus of the invention, furthermore, the correction table stores data which indicate an inverse characteristic of the nonlinear amplification characteristic that is calculated with using an LMS algorithm.

According to the configuration, it is possible to provide a power amplifying apparatus which has a stable and high linearity.

Figure 1:
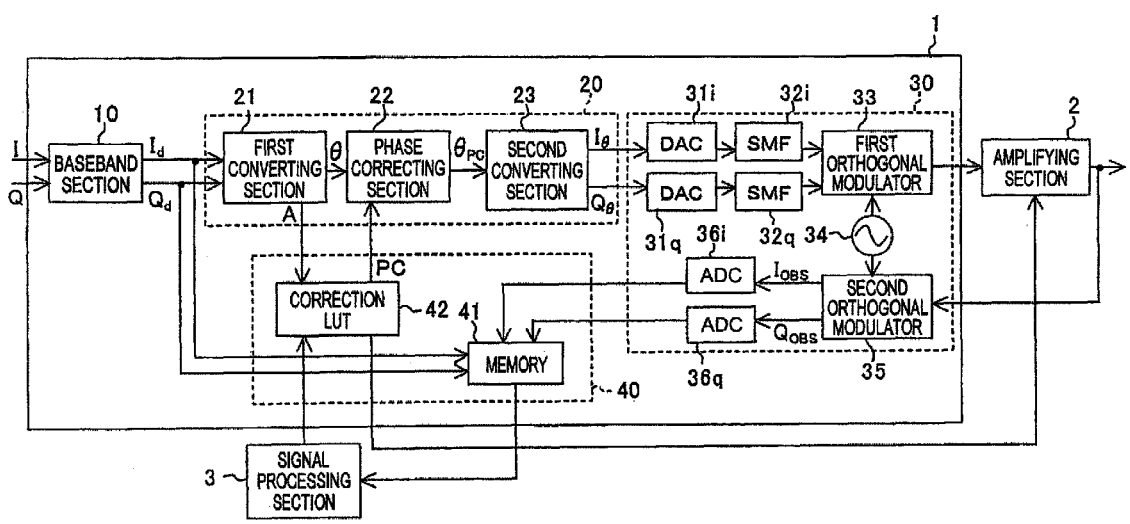
FIG. 1 is a diagram showing a transmission circuit illustrating an embodiment of the invention.

In the figures, the reference numeral 1 denotes an amplification controlling/modulating section, 2 denotes an amplifying section, 3 denotes a signal processing section, 10 denotes a baseband section, 20 denotes a signal converting section, 21 denotes a first converting section, 22 denotes a phase correcting section, 23 denotes a second converting section, 30 denotes an orthogonal modulating section, 31*i* and 31*q* denote DA converters, 32*i* and 32*q* denote smoothing filters, 33 denotes a first orthogonal modulator, 34 denotes a local oscillator 34, 35 denotes a second orthogonal modulator, 36*i* and 36*q* denote AD converters, 40 denotes a correcting section, 41 denotes a memory, and 42 denotes a correction table.

BEST MODE FOR CARRYING OUT THE INVENTION

FIG. 1 is a diagram showing a power amplifying apparatus illustrating an embodiment of the invention. As shown in the figure, the power amplifying apparatus of the first embodiment includes an amplification controlling/modulating section 1 having a baseband section 10, a signal converting section 20, an orthogonal modulating section 30, and a correcting section 40; an amplifying section 2; and a signal processing section 3. The power amplifying apparatus of the embodiment is a power amplifying apparatus of the LINC method in which a nonlinear power amplifier is used in the amplifying section 2.

The baseband section 10 is configured by a digital RC filter, and the like, conducts baseband band limitation on each of an in-phase component (hereinafter, I signal) and orthogonal component (hereinafter, Q signal) of an input signal, and outputs signals Id, Qd of respectively the in-phase component and the orthogonal component. The output signals Id, Qd of the baseband section 10 are signals of the orthogonal coordinate system.

The signal converting section 20 includes a first converting section 21, a phase correcting section 22, and a second converting section 23.

The first converting section 21 converts the signals $I_d$, $Q_d$ output from the baseband section 10, to an amplitude signal A and phase signal θ of the polar coordinate system. The conversion is indicated by Exps. (2) to (4):

$$I_d + jQ_d = A \cdot \exp(j\theta) \quad (2)$$

$$A = (I_d^2 + Q_d^2)^{1/2} \quad (3)$$

$$\theta = \arg(Q_d/I_d) \quad (4)$$

The amplitude component A output by the first converting section 21 is input to the correcting section 40, and the phase component θ is input to the phase correcting section 22, together with a phase correction signal PC from the correcting section 40 which will be described later.

On the basis of the phase signal θ output from the first converting section 21 and the phase correction signal PC output from the correcting section 40, the phase correcting section 22 outputs a corrected phase signal $\theta_{pc}$ to the second converting section 23.

The second converting section 23 again converts the phase signal $\theta_{pc}$ output from the phase section 22 to the orthogonal coordinate system, and outputs $I_\theta$, $Q_\theta$ to the orthogonal modulating section 30.

The orthogonal modulating section 30 includes DA converters (hereinafter, DACs) 31*i*, 31*q*, smoothing filters (hereinafter, SMFs) 32*i*, 32*q*, a first orthogonal modulator 33, a local oscillator 34, a second orthogonal modulator 35, and AD converters (hereinafter, ADCs) 36*i*, 36*q*.

The DACs 31*i*, 31*q* convert the signals $I_\theta$, $Q_\theta$ output from the signal converting section 20 to analog signals, respectively, and the SMFs 32*i*, 32*q* remove alias from signals output from the DACs 31*i*, 31*q*.

The first orthogonal modulator 33 and the local oscillator 34 perform orthogonal modulation by the direct orthogonal modulation method on the signals output from the SMFs 32*i*, 32$q$. The orthogonal-modulated signal is indicated by exp (j$\theta$+PC). The orthogonal-modulated signal is output from the first orthogonal modulator 33 to the amplifying section 2.

An orthogonal modulation LSI or the like is used as the first orthogonal modulator 33. Because of development of the direct orthogonal modulation method, an orthogonal modulation LSI having a baseband modulation bandwidth which is larger than 300 MHz has been developed. When such an orthogonal modulation LSI or the like is used, the power amplifying apparatus can be adapted to a broadband system. As described above, orthogonal modulation can be performed by reconverting the phase component to the orthogonal coordinate system. Therefore, it is not required to directly phase modulate the VCO, and the power amplifying apparatus can be adapted to a broadband system.

Since the orthogonal-modulated signal has only the phase component, a nonlinear power amplifier can be used in the amplifying section 2. Therefore, it is possible to provide an amplifying apparatus of the LINC method which can be applied to a broadband system. When a nonlinear power amplifier in which the efficiency of an output signal with respect to an input signal is high, the power consumption can be reduced. In the case where the amplifying apparatus is applied to a mobile terminal apparatus, particularly, the life period of a battery can be prolonged.

In order to feed back an output signal from the power amplifying section 2, the second orthogonal modulator 35 and the local oscillator 34 perform orthogonal modulation by the direct orthogonal modulation method, and output an in-phase signal $I_{OBS}$ and orthogonal signal $Q_{OBS}$ of a supervisory signal. The local oscillator 34 which is used in the orthogonal modulation for obtaining the supervisory signals $I_{OBS}$, $Q_{OBS}$ for feedback may be used also as the local oscillator 34 for orthogonally modulating the phase signal for amplification. As the second orthogonal modulator 35, an orthogonal modulation LSI or the like is used in the same manner as the first orthogonal modulator 33.

The supervisory signals $I_{OBS}$, $Q_{OBS}$ output from the second orthogonal modulator 35 are converted to digital signals by the ADCs 36$i$, 36$q$, and then input to the correcting section 40.

The correcting section 40 includes a memory 41 and a correction lookup table (hereinafter, correction LUT) 42, and performs a feedback control such as adaptive pre-distortion (hereafter, APD) to compensate distortion which is the nonlinear amplification characteristic of the AM-AM characteristic and AM-PM characteristic of an output signal with respect to an input signal. The memory 41 and the correction LUT 42 are configured by a RAM or the like.

In the embodiment, as the method of compensating distortion by a feedback control, a method in which inverse characteristics of the AM-AM characteristic and the AM-PM characteristic are estimated with using the LMS (Least Mean Square) algorithm will be exemplarily described. The LMS algorithm has advantages that the stability is excellent, and that the computational complexity is small.

The memory 41 stores the signals $I_d$ and $Q_d$ output from the baseband section 10, and the signals $I_{OBS}$ and $Q_{OBS}$ output from the signal converting section 20.

The correction LUT 42 uses the amplitude signal A output from the first converting section 21 as an LUT address, and stores correction data which are calculated by the signal processing section 3 on the basis of $I_d$ and $Q_d$, and $I_{OBS}$ and $Q_{OBS}$ stored in the memory 41. The signal processing section 3 compares $I_d$ and $Q_d$, and $I_{OBS}$ and $Q_{OBS}$, and calculates the correction data in which the least square error is at the minimum, with using the LMS algorithm.

Figure 2:
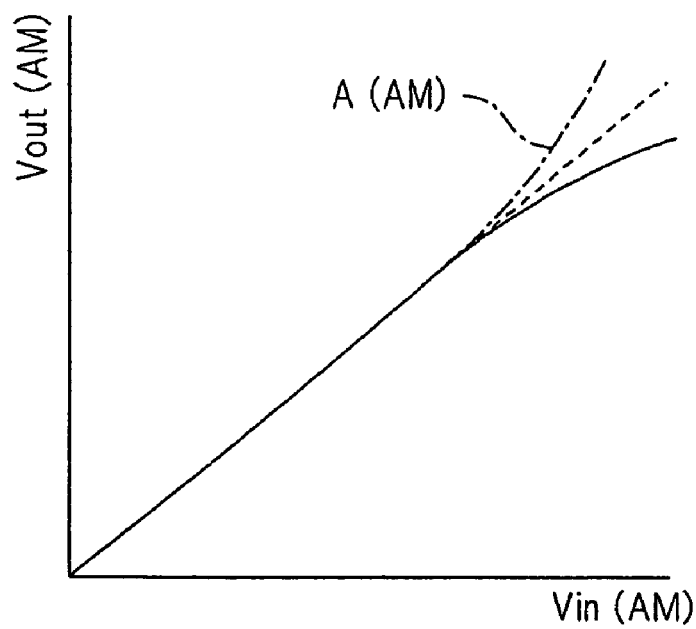
FIG. 2 is a view showing an example of AM-AM characteristic correction in the embodiment of the invention.
Figure 3:
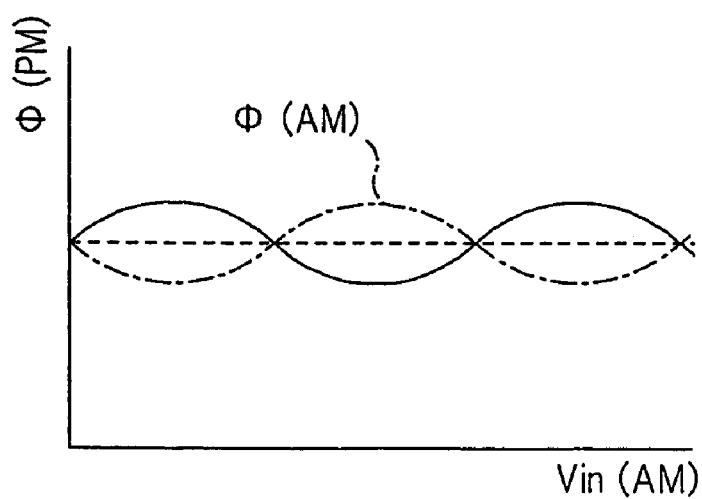
FIG. 3 is a view showing an example of AM-PM characteristic correction in the embodiment of the invention.
Figure 4:
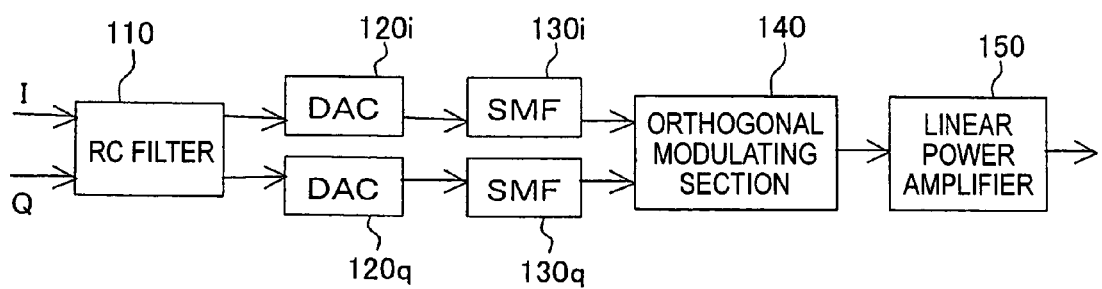
FIG. 4 is a view showing a conventional power amplifying apparatus.
Figure 5:
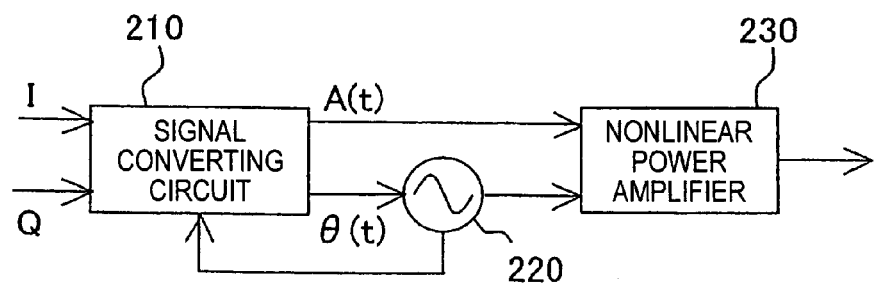
FIG. 5 is a view showing a conventional power amplifying apparatus of the LINC method.

The correction data includes a correction gain control signal CAGC output to the amplifying section 2, and the phase correction signal PC output to the signal converting section 20. The correction gain control signal CAGC corresponds to the inverse characteristic of the AM-AM characteristic, and the phase correction signal PC corresponds to the inverse characteristic of the AM-PM characteristic. FIG. 2 shows the AM-AM characteristic and its inverse characteristic, and FIG. 3 shows the AM-PM characteristic and its inverse characteristic.

The correction gain control signal CAGC, and the signal exp(j$\theta$+PC) output from the orthogonal modulating section 30 are input to the amplifying section 2. Based on the signals, an amplifying process is performed, and an output signal of the power amplifying apparatus is obtained.

According to the power amplifying apparatus of the embodiment of the invention, the signals input to the signal converting section 20 are converted to the amplitude signal and the phase signal, and the phase signal is reconverted to the orthogonal coordinate system, whereby direct orthogonal modulation of the phase signal is enabled. Because of development of the direct orthogonal modulation method, an orthogonal modulation LSI having a baseband modulation bandwidth which is larger than 300 MHz has been developed. Therefore, a power amplifying apparatus of the LINC method can be applied to a broadbanded system without newly developing a VCO having a high control response speed.

A feedback control such as APD is applied to the amplitude signal A, thereby enabling to provide a power amplifying apparatus of the LINC method in which the linearity of the gain control is held, even when applied to a system having a high dynamic range.

The phase correction signal PC is produced by the correcting section 40, whereby distortion caused by reconversion of the phase signal can be eliminated. From the viewpoint of holding the linearity of the gain control, however, it is not necessary to perform the distortion compensation due to the phase correction signal PC.

Each of the signal converting section 20 and the orthogonal modulating section 30 can be integrated into one chip. Furthermore, the whole of the amplification controlling/modulating section 1 may be integrated into one chip. Therefore, a transmission circuit can be miniaturized.

The power amplifying apparatus according to the embodiment of the invention includes: the signal converting section 20 which converts an input signal of the orthogonal coordinate system to an amplitude signal and phase signal of the polar coordinate system, which then converts the phase signal to an orthogonal-coordinate phase signal of the orthogonal coordinate system, and which outputs the amplitude signal and the orthogonal-coordinate phase signal; the modulating section 30 which performs orthogonal modulation on the orthogonal-coordinate phase signal, and which outputs the modulated signal to the nonlinear power amplifier 2; and the correcting section 40 which outputs a gain control signal for the nonlinear power amplifier 2. The correcting section 40 has the correction LUT which is produced on the basis of an output signal of the nonlinear power amplifier 2 and the input signal of the orthogonal coordinate system, and outputs the gain control signal with reference to the correction LUT on the basis of the amplitude signal. According to the configuration, the power amplifying apparatus can be adapted to a broadbanded communication system, and, even when applied to a signal having a high dynamic range, a gain control holding a high linearity is enabled.

The amplifying apparatus can be applied to, for example, a base station in a third-generation communication system such as the CDMA system, base and mobile stations in a fourth-generation communication system such as the OFDM system, and a transmission system such as a wireless LAN.

In the embodiment, the case where the LMS algorithm is used as the method of compensating distortion by a feedback control has been described. However, the invention is not restricted to this, and various adaptive algorithms and the like may be used.

Although the invention has been described in detail and with reference to the specific embodiment, it is obvious to those skilled in the art that various changes and modifications can be made without departing from the spirit and scope of the invention.

The present application is based on Japanese Patent Application (No. 2003-174957) filed on Jun. 19, 2003, and its components are incorporated herein by reference.

INDUSTRIAL APPLICABILITY

The invention is useful as a power amplifying apparatus and the like which can be applied also to a broadband communication system using a broadband and high dynamic signal.

The invention claimed is:

1. A power amplifying apparatus that performs linear amplification by using a nonlinear power amplifier, the apparatus comprising:

a signal converting section that converts an input signal of an orthogonal coordinate system to an amplitude signal and a phase signal of a polar coordinate system, then corrects the phase signal, converts the corrected phase signal to an orthogonal-coordinate phase signal of the orthogonal coordinate system, and outputs the amplitude signal and the orthogonal-coordinate phase signal;

a modulating section that performs orthogonal modulation on the corrected orthogonal-coordinate phase signal, and that outputs the modulated signal to the nonlinear power amplifier; and a correcting section that outputs a gain control signal for the nonlinear power amplifier, and a phase correction signal that is used in the correction of the phase signal in the signal converting section, wherein the correcting section has a correction table that is produced on a basis of an output signal of the nonlinear power amplifier and the input signal of the orthogonal coordinate system, and outputs the gain control signal and the phase correction signal with reference to the correction table on the basis of the amplitude signal.

2. The power amplifying apparatus according to claim 1, wherein at least one of the signal converting section, the modulating section, and the correcting section is integrated into one chip.

3. The power amplifying apparatus according to claim 1, wherein the correction table stores data that indicate an inverse characteristic of a nonlinear amplification characteristic that is calculated by using an LMS algorithm.

* * * * *